(12) United States Patent
Hsiao et al.

(10) Patent No.: US 9,252,233 B2
(45) Date of Patent: Feb. 2, 2016

(54) AIR-GAP OFFSET SPACER IN FINFET STRUCTURE

(71) Applicant: Taiwan Semiconductor Manufacturing Co., Ltd., Hsin-Chu (TW)

(72) Inventors: Ru-Shang Hsiao, Jhubei (TW); Rou-Han Kuo, Chaozhou Township (TW); Ting-Fu Lin, Taichung (TW); Sheng-Fu Yu, Chiayi (TW); Tzung-Da Liu, Minxiong Township (TW); Li-Yi Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 21 days.

(21) Appl. No.: 14/205,971

(22) Filed: Mar. 12, 2014

(65) Prior Publication Data

US 2015/0263122 A1    Sep. 17, 2015

(51) Int. Cl.
*H01L 29/78* (2006.01)
*H01L 29/51* (2006.01)
*H01L 29/66* (2006.01)
*H01L 21/311* (2006.01)

(Continued)

(52) U.S. Cl.
CPC ............ *H01L 29/515* (2013.01); *H01L 21/311* (2013.01); *H01L 21/823431* (2013.01); *H01L 21/823468* (2013.01); *H01L 29/4991* (2013.01); *H01L 29/518* (2013.01); *H01L 29/6653* (2013.01); *H01L 29/6656* (2013.01); *H01L 29/66545* (2013.01); *H01L 29/66553* (2013.01); *H01L 29/66795* (2013.01); *H01L 29/785* (2013.01)

(58) Field of Classification Search
CPC ............ H01L 29/4991; H01L 29/6653; H01L 29/66553; H01L 29/6656; H01L 29/66795; H01L 29/785; H01L 21/823431; H01L 21/823468

See application file for complete search history.

(56) References Cited

U.S. PATENT DOCUMENTS 5,736,446 A * 4/1998 Wu .............................. 438/305
5,914,519 A    6/1999 Chou et al.

(Continued)

OTHER PUBLICATIONS

Endo, et al. "Atomic Layer Deposition of 25-nm-thin Sidewall Spacer for Enhancement of FinFET Performance." IEEE Solid State Device Research Conference Published in Sep. 2011. 28 Pages.

(Continued)

*Primary Examiner* — Bac Au
*Assistant Examiner* — Toniae Thomas
(74) *Attorney, Agent, or Firm* — Eschweiler & Associates, LLC

(57) ABSTRACT

The present disclosure relates to a method of forming a FinFET device having sidewalls spacers comprising an air gap that provides for a low dielectric constant, and an associated apparatus. In some embodiments, the method is performed by forming a fin of semiconductor material on a semiconductor substrate. A gate structure, having a gate dielectric layer and an overlying gate material layer, is formed at a position overlying the fin of semiconductor material. Sidewall spacers are formed at positions abutting opposing sides of the gate structure. Respective sidewall spacers have a first layer of insulating material abutting the gate structure and a second layer of insulating material separated from the first layer of insulating material by an air gap. By forming the FinFET device to have sidewall spacers with air gaps, the parasitic capacitance of the FinFET device and a corresponding RC time delay are decreased.

20 Claims, 6 Drawing Sheets

(51) Int. Cl.
  *H01L 21/8234*  (2006.01)
  *H01L 29/49*    (2006.01)

(56) References Cited

U.S. PATENT DOCUMENTS

| | | | | |
|---|---|---|---|---|
| 5,915,182 | A * | 6/1999 | Wu | 438/299 |
| 8,445,340 | B2 * | 5/2013 | Lee et al. | 438/163 |
| 2004/0155269 | A1 * | 8/2004 | Yelehanka | H01L 21/76895 257/288 |
| 2005/0048754 | A1 * | 3/2005 | Yeh | H01L 21/823468 438/595 |
| 2007/0037342 | A1 * | 2/2007 | Mehrad | H01L 21/28097 438/230 |
| 2008/0254579 | A1 * | 10/2008 | Chi et al. | 438/199 |
| 2011/0193175 | A1 | 8/2011 | Huang et al. | |
| 2013/0277686 | A1 * | 10/2013 | Liu et al. | 257/77 |
| 2013/0299920 | A1 * | 11/2013 | Yin et al. | 257/408 |
| 2014/0042491 | A1 * | 2/2014 | Chen et al. | 257/190 |
| 2014/0138779 | A1 * | 5/2014 | Xie et al. | 257/401 |
| 2014/0217520 | A1 * | 8/2014 | Niebojewski et al. | 257/412 |
| 2015/0035023 | A1 * | 2/2015 | Kim et al. | 257/288 |

OTHER PUBLICATIONS

Huang, et al. "Low-K Spacers for Advanced Low Power CMOS Devices with Reduced Parasitic Capacitances." IEEE International SOI Conference Proceedings. Published in 2008. 2 Pages.

* cited by examiner

AIR-GAP OFFSET SPACER IN FINFET STRUCTURE

BACKGROUND

As integrated chips continue to decrease in size, limitations in processing capabilities and in fundamental material characteristics have made scaling of planar CMOS transistors increasingly difficult (e.g., due to leakage current and process variations). FinFET (Field effect transistors) devices have long been looked to as a promising alternative to planar CMOS transistors. In recent years, advances in processing technology have made FinFET devices a viable option in emerging technology nodes (e.g., 22 nm and below).

FinFET devices are three-dimensional structures that have a conductive channel region comprising a fin of semiconductor material that rises above a substrate as a three-dimensional structure. A gate structure, configured to control the flow of charge carriers within the conductive channel region, wraps around the fin of semiconductor material. For example, in a tri-gate FinFET structure, the gate structure wraps around three sides of a fin of semiconductor material, thereby forming conductive channel regions on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
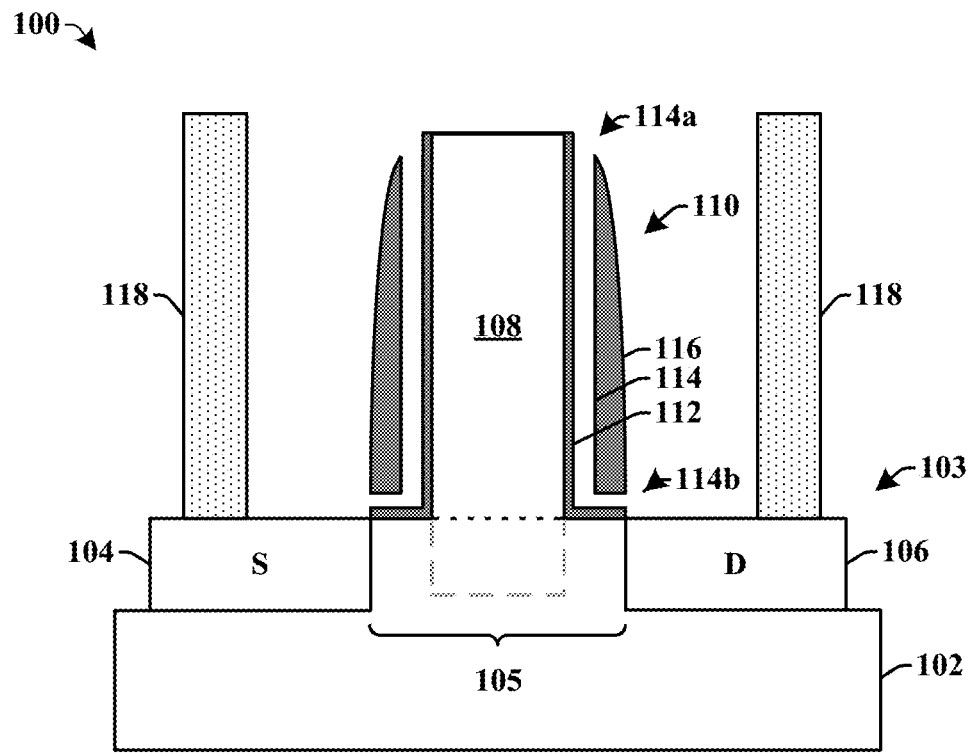
FIG. 1 illustrates a cross-sectional view of some embodiments of a FinFET (field effect transistor) device having sidewalls spacers comprising air gaps.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FinFET (field effect transistor) devices comprise a three dimensional fin of semiconducting material that extends between source and drain regions. A gate structure is disposed over the fin of semiconducting material. Often FinFET devices further comprise sidewall spacers disposed along the sidewalls of a gate structure. The sidewall spacers comprise an electrically insulating material that is configured to define a lateral space between the gate structure and the source and drain regions of the FinFET device.

As the size of integrated chip components continues to shrink, the parasitic capacitance through such sidewall spacers has become an increasing contributor to the total parasitic capacitance of a FinFET device. For example, sidewall spacers disposed around a gate structure of a FinFET device have a dielectric constant that increases a parasitic capacitance between the gate structure and the source and drain regions and between the gate structure and source and drain contacts. The parasitic capacitance degrades the performance of the FinFET device by inducing an RC time delay.

Accordingly, the present disclosure relates to a method of forming a FinFET (field effect transistor) device having sidewall spacers comprising air gaps that provide for a low dielectric constant, and an associated apparatus. In some embodiments, the method comprises forming a fin of semiconductor material on a semiconductor substrate. A gate structure, comprising a gate dielectric layer and an overlying gate material layer, is formed at a position overlying the fin of semiconductor material. Sidewall spacers are formed at positions abutting opposing sides of the gate structure. Respective sidewall spacers comprise a first layer of insulating material abutting the gate structure and a second layer of insulating material separated from the first layer of insulating material by an air gap. By forming the FinFET device to have sidewall spacers with air gaps, the parasitic capacitance of the FinFET device and a corresponding RC time delay are decreased.

FIG. 1 illustrates a cross-sectional view of some embodiments of a FinFET (field effect transistor) device 100 having sidewalls spacers comprising air gaps.

The FinFET device 100 comprises a fin of semiconductor material 103 (e.g., silicon) that protrudes from a semiconductor substrate 102 as a three-dimensional structure. The fin of semiconductor material 103 comprises a source region 104 and a laterally separated drain region 106. The source region 104 and the drain region 106 are highly doped regions, which may have a doping concentration of between $10^{16}$ cm$^{-3}$ and $10^{18}$ cm$^{-3}$, for example. The source and drain regions, 104 and 106, are separated by a channel region 105 that extends along the fin of semiconductor material 103.

A gate structure 108 is disposed over the semiconductor substrate 102 at a position that straddles the fin of semiconductor material 103. For example, the gate structure 108 may contact a top surface and sidewalls of the fin of semiconductor material 103. The gate structure 108 is configured to control the flow of charge carriers in the channel region 105.

Electrically insulating sidewall spacers 110 are disposed at positions abutting sidewalls of the gate structure 108. The sidewall spacers 110 comprise air gaps 114, which are configured to provide the sidewall spacers 110 with an extremely low dielectric constant (e.g., k~1). The low dielectric constant of the sidewall spacers 110 reduces the parasitic capacitance between the gate structure 108 and the source and drain regions, 104 and 106, and between the gate structure 108 and source and drain contacts 118. The reduced parasitic capacitance improves the performance of the FinFET device 100 by reducing an RC time delay and thereby increasing the speed of the FinFET device 100.

In some embodiments, the air gaps 114 may be located between a first layer of insulating material 112 and a second layer of insulating material 116. For example, the first layer of insulating material 112 may be disposed onto sidewalls of the gate structure 108 and a top surface of the fin of semiconductor material 103, the air gaps 114 may abut the first layer of insulating material 112, and the second layer of insulating material 116 may abut the air gaps 114. In some embodiments, the first and second layers of insulating material, 112 and 116, may comprise silicon nitride (SiN).

In some embodiments, the air gaps 114 comprise cavities extending continuously between a first opening 114a in the sidewall spacers 110 and a second opening 114b in the sidewall spacers 110. In some embodiments, the air gaps 114 may comprise cavities having an 'L' shape, with the first opening 114a at a top of the 'L' shape and the second opening 114b at a bottom of the 'L' shape. In other embodiments, the air gaps 114 may comprise non-continuous cavities disposed between the first layer of insulating material 112 and the second layer of insulating material 116.

Figure 2:
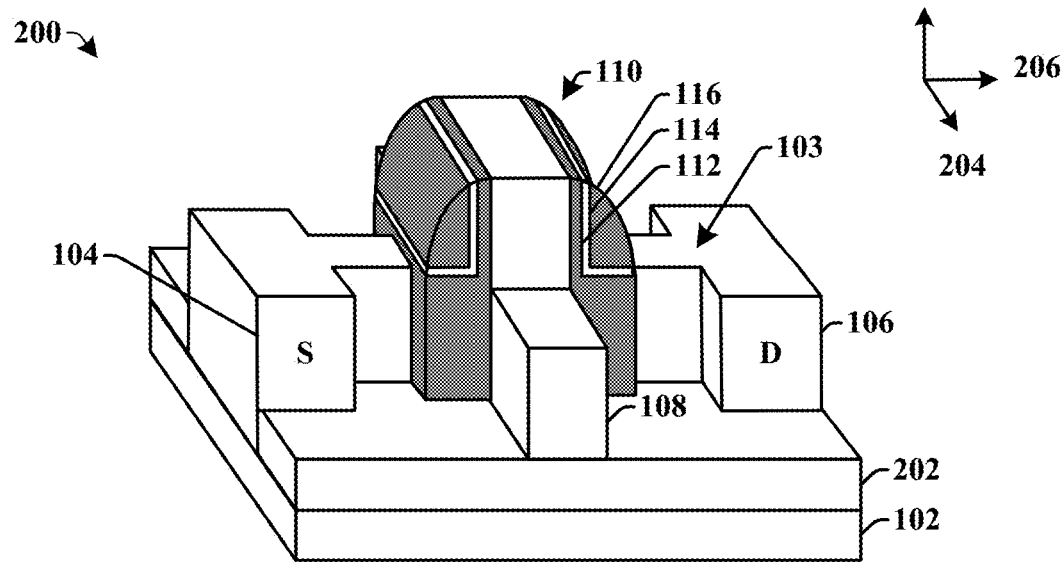
FIG. 2 illustrates a three-dimensional view of some embodiments of a FinFET device having sidewalls spacers comprising air gaps.

FIG. 2 illustrates a three-dimensional view of some embodiments of a FinFET (field effect transistor) device 200 having sidewalls spacers comprising an air gap.

The FinFET device 200 comprises a three-dimensional fin of semiconductor material 103 disposed onto a semiconductor substrate 102. In various embodiments, the semiconductor substrate 102 may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith.

The fin of semiconductor material 103 protrudes from the semiconductor substrate 102 as a positive relief that vertically extends through an isolating material 202. The fin of semiconductor material 103 laterally extends along a first direction 206 between a source region 104 and a drain region 106. A gate structure 108 is disposed over the semiconductor substrate 102 at a position that straddles fin of semiconductor material 103. The gate structure 108 extends along a second direction 208 perpendicular to the first direction 206.

Electrically insulating sidewall spacers 110 are disposed at positions laterally abutting the sidewalls of gate structure 108. In some embodiments, the sidewall spacers 110 extend from a top surface of the gate structure 108 to a bottom surface of the gate structure 108. In such embodiments, the sidewall spacers 110 may have a height is more than twice as large as the width.

Figure 3A:
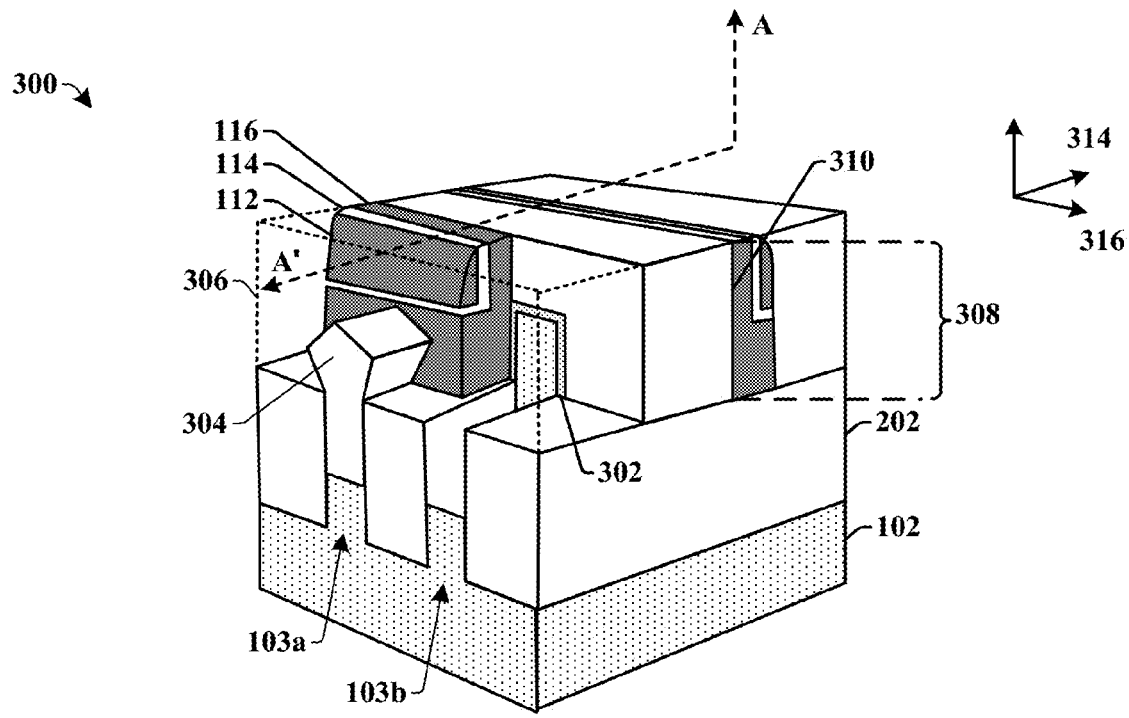
FIGS. 3A-3B illustrate some alternative embodiments of a substrate having FinFET devices with sidewall spacers comprising air gaps.
Figure 3B:
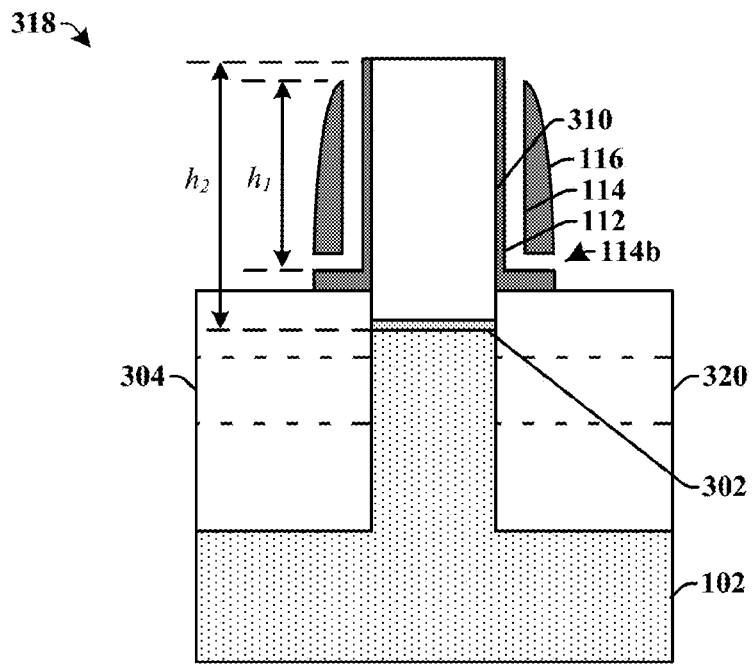

FIGS. 3A-3B illustrate some alternative embodiments of a substrate having FinFET devices with sidewall spacers comprising air gaps.

FIG. 3A illustrates a three-dimensional view 300 of some additional embodiments of a substrate having FinFET (field effect transistor) devices with sidewalls spacers comprising air gaps. FIG. 3B illustrates a corresponding cross-sectional view 318 of the substrate of FIG. 3A shown along cross-sectional line A-A'.

The substrate comprises three-dimensional fins 103a-103b that extend outward from a semiconductor substrate 102. The three-dimensional fins 103a-103b are separated from one another by an isolating material 202, so that the three-dimensional fins 103a-103b are interleaved between sections of the isolating material 202. The three-dimensional fins 103a-103b extend along a first direction 314 between a source region 304 and a drain regions 320 disposed within a dielectric layer 306 (e.g., an inter-level dielectric material). In some embodiments, the dielectric layer 306 may comprise an oxide, a low-k dielectric material, or an ultra low-k dielectric material.

A gate structure 308 overlies the three-dimensional fins 103a-103b. The gate structure 308 extends along a second direction 316 perpendicular to the first direction 314 and overlies the alternating sections of three-dimensional fins 103a-103b and sections of isolating material 202. The gate structure 308 comprises a gate material layer 310 separated from the three-dimensional fins 103a-103b by a gate dielectric layer 302. In some embodiments, the gate dielectric layer 302 may comprise a silicon dioxide (e.g., $SiO_2$) layer or a high-k dielectric layer. In various embodiments, the gate material layer 310 may comprise a poly-silicon layer or a metal gate layer (e.g., aluminum, aluminum oxide, etc.).

Sidewall spacers 110 may be located on opposing sides of the gate structure 308. The sidewall spacers 110 comprise air gaps 114 disposed between first and second layers of insulating material, 112 and 116. The air gaps 114 are located at a position overlying the source and drain regions, 104 and 106, so that the air gaps 114 have a height that is less than that of the gate structure 308. For example, the air gaps 114 may have a height of $h_1$, while the gate structure 308 has a height of $h_2$ that is larger than $h_1$.

In some embodiments, the air gaps 114 comprise an 'L' shaped air gap having an opening 114a that is disposed at a position within the side of the sidewall spacers 110 that is above the source and drain regions, 104 and 106. In some embodiments, the opening 114b is at a position within the side of the sidewall spacers 110 that is vertically above a portion of the sidewall spacers 110.

Figure 4:
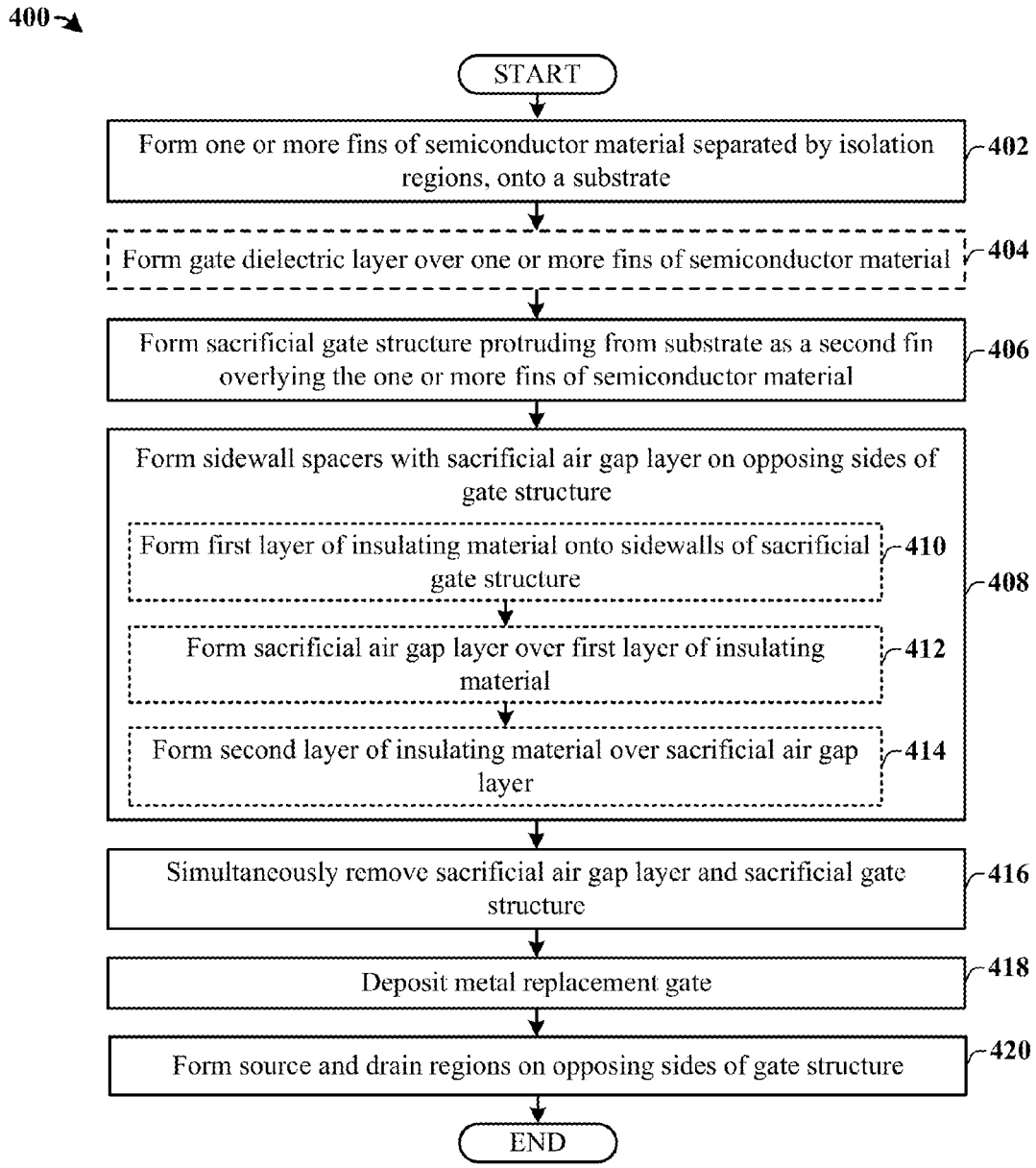
FIG. 4 illustrates a flow diagram of some embodiments of a method of forming a FinFET device with sidewall spacers comprising air gaps.

FIG. 4 illustrates a flow diagram of some embodiments of a method 400 of forming a FinFET device with sidewall spacers comprising an air gap.

While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, one or more fins of semiconductor material are formed over a semiconductor substrate. The one or more fins of semiconductor material protrude from the semiconductor substrate as a three-dimensional structure. In some embodiments, the fins of semiconductor material may be separated from one another by sections of isolating material.

At 404, a gate dielectric layer may be formed over the one or more fins of semiconductor material, in some embodiments.

At 406, a sacrificial gate structure is formed at a position straddling the one or more fins of semiconductor material. The sacrificial gate structure protrudes from the semiconductor substrate as a second fin overlying the one or more fins of semiconductor material. In some embodiments, the sacrificial gate structure may be formed onto the gate dielectric layer.

At 408, sidewall spacers having sacrificial air gap layers are formed on opposing sides of the sacrificial gate structure.

In some embodiments, the sidewall spacers may be formed by selectively depositing a first layer of insulting material (e.g., SiN) onto the sidewalls of the sacrificial gate structure, at 508. A sacrificial air gap layer (e.g., polysilicon) is subsequently formed onto the first layer of insulting material, at 510. At 512, a second layer of insulting material (e.g., SiN) is formed onto the sacrificial air gap layer.

At 416, the sacrificial air gap layer and the sacrificial gate structure are removed. In some embodiments, the sacrificial gate structure and the sacrificial air gap layer are simultaneously removed by way of a same etching process. Removing the sacrificial air gap layer results in sidewall spacers having air gaps comprising a cavity. The air gaps provide the sidewall spacers with a low dielectric value (e.g., k~1).

At 418, a replacement gate structure is formed in a position of the removed sacrificial gate structure. In some embodiments, formation of the replacement gate structure comprises depositing an inter-layer gate dielectric layer or a high-k gate dielectric layer in the position of the removed sacrificial gate structure, prior to deposition of the metal replacement gate over the gate dielectric layer.

At 420, source and drain regions are formed within the one or more fins of semiconductor material on opposite sides of the gate structure. The position of the source and drain regions (e.g., or lightly doped source and drain regions) is defined by the sidewall spacers. For example, in some embodiments, an implantation process is performed to form the source and drain regions by selectively implanting a dopant species into the one or more fins of semiconductor material. In such embodiments, the sidewalls spacers operate as a masking layer for the implantation process.

In other embodiments, the source region and the drain region are formed by epitaxial growth of a doped semiconductor material within the source and drain recesses within the one or more fins of semiconductor material. For example, in some embodiments, a source recess and a drain recess may be formed, and then an epitaxial material may be deposited within the source and drain recesses to form the source and drain regions.

FIGS. 5-10 illustrate some embodiments of cross-sectional views of a semiconductor substrate showing a method of forming a FinFET device having sidewall spacers with air gaps. Although FIGS. 5-10 are described in relation to method 400, it will be appreciated that the structures disclosed in FIGS. 5-10 are not limited to such a method.

Figure 5:
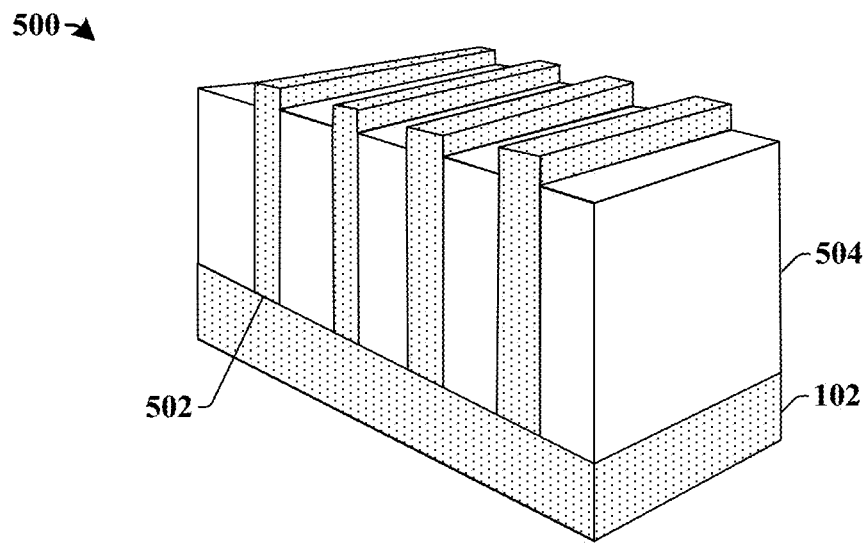
FIGS. 5-10 illustrate some embodiments of cross-sectional views of a semiconductor substrate showing a method of forming a FinFET device with sidewall spacers comprising air gaps.

FIG. 5 illustrates a cross-sectional view 500 of some embodiments of a semiconductor substrate corresponding to act 402.

As shown in cross-sectional view 500, one or more fins of semiconductor material 502 are formed over a semiconductor substrate 102. The one or more fins of semiconductor material 502 protrude outward from the semiconductor substrate 102 as three-dimensional structures. The one or more fins of semiconductor material 502 are separated by sections of isolating material 504, so that the one or more fins of semiconductor material 502 are interleaved between the sections of isolating material 504.

In some embodiments, the one or more fins of semiconductor material 502 may be formed by selectively exposing the semiconductor substrate 102 to an etchant (e.g., Tetramethylammonium hydroxide (TMAH), potassium hydroxide (KOH), etc.) configured to etch the semiconductor substrate to form trenches. An isolating material 504 (e.g., oxide) is then formed within the trenches between the sections of semiconductor material. The semiconductor substrate 102 is then planarized and the isolating material 504 is etched back so that the sections of semiconductor material protrude as the one or more fins of semiconductor material 502 above the isolating material 504.

Figure 6:
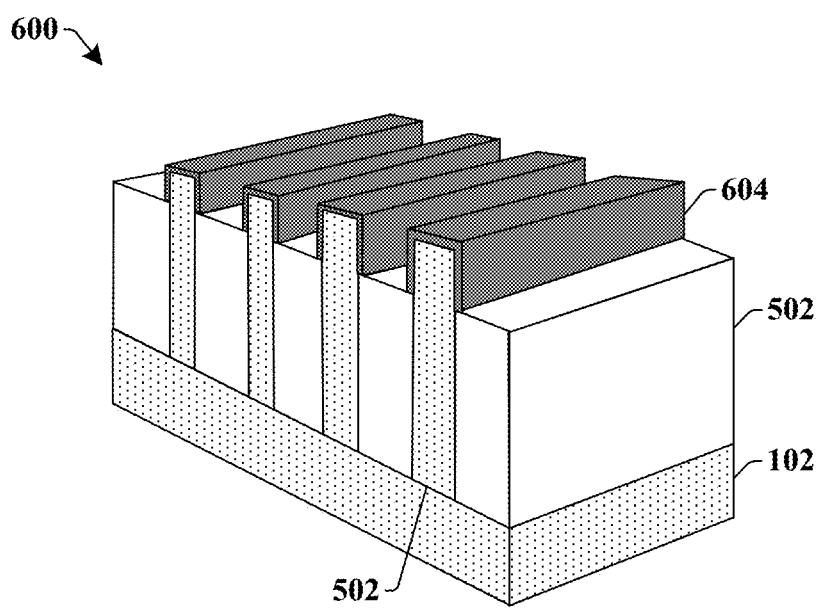

FIG. 6 illustrates a cross-sectional view 600 of some embodiments of a semiconductor substrate corresponding to act 404.

As shown in cross-sectional view 600, a gate dielectric layer 604 may be selectively formed onto the one or more fins of semiconductor material 502. In some embodiments, the gate dielectric layer 604 may comprise a silicon dioxide (e.g., $SiO_2$) layer or a high-k dielectric layer. In other embodiments, the gate dielectric layer 604 may comprise a high-k dielectric layer such as hafnium oxide ($HfO_2$), titanium dioxide ($TiO_2$), hafnium zirconate (HfZrO), Tantalum pentoxide ($Ta_2O_3$), etc.

Figure 7:
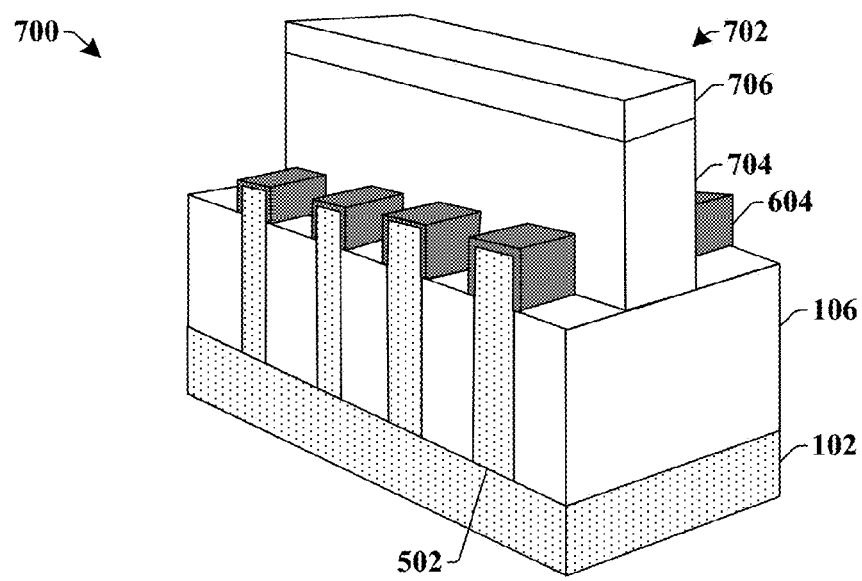

FIG. 7 illustrates a cross-sectional view 700 of some embodiments of a semiconductor substrate corresponding to act 406.

As shown in cross-sectional view 700, a sacrificial gate structure 702 is formed over the one or more three-dimensional fins of semiconductor material 502. In some embodiments, the sacrificial gate structure 702 may be formed by depositing polysilicon 704 over the gate dielectric layer 604. A patterned hard mask layer 706 is subsequently formed onto the polysilicon 704. In various embodiments, the patterned hard mask layer 706 may comprise any suitable hard mask material, such as an oxide or silicon nitride (SiN), for example. The polysilicon 704 is then etched according to the patterned hard mask layer 706 to form the sacrificial gate structure 702 overlying the one or more fins of semiconductor material 502.

Figure 8C:
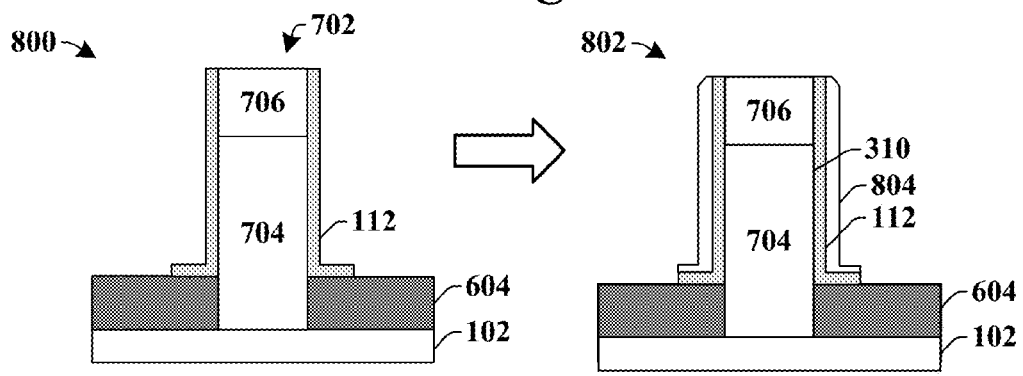
Figure 8C:
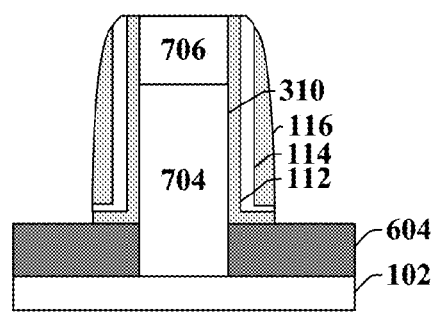

FIGS. 8A-8C illustrate cross-sectional views of some embodiments of a semiconductor substrate corresponding to act 408.

As shown in cross-sectional view 800, a first layer of insulating material 112 is formed. The first layer of insulating material 112 is formed as a continuous film that extends from the sidewall of the sacrificial gate structure 702 to a position overlying the three dimensional fins of semiconductor material 502 and/or the gate dielectric layer 604. In some embodiments, the first layer of insulating material 112 may comprise silicon nitride (SiN). In some embodiments, the first layer of insulating material 112 may be deposited by a deposition technique (e.g., chemical vapor deposition, physical vapor deposition, etc.).

As shown in cross-sectional view 802, a sacrificial air gap layer 804 is formed onto the first layer of insulating material 112. The sacrificial air gap layer 804 is formed onto the first layer of insulating material 112 as a continuous film that extends in lateral and vertical directions. In some embodiments, the sacrificial air gap layer 804 may comprise polysilicon. In some embodiments, the sacrificial air gap layer 804 may be deposited by a deposition technique (e.g., chemical vapor deposition, physical vapor deposition, etc.).

As shown in cross-sectional view 806, a second layer of insulating material 116 is formed onto the sacrificial air gap layer 804. The second layer of insulating material 116 is formed onto the sacrificial air gap layer 804 as a continuous film that extends in lateral and vertical directions. In some embodiments, the second layer of insulating material 116 may comprise silicon nitride (SiN). In some embodiments, the second layer of insulating material 116 may be deposited by a deposition technique (e.g., chemical vapor deposition, physical vapor deposition, etc.).

Figures 9A, 9B:
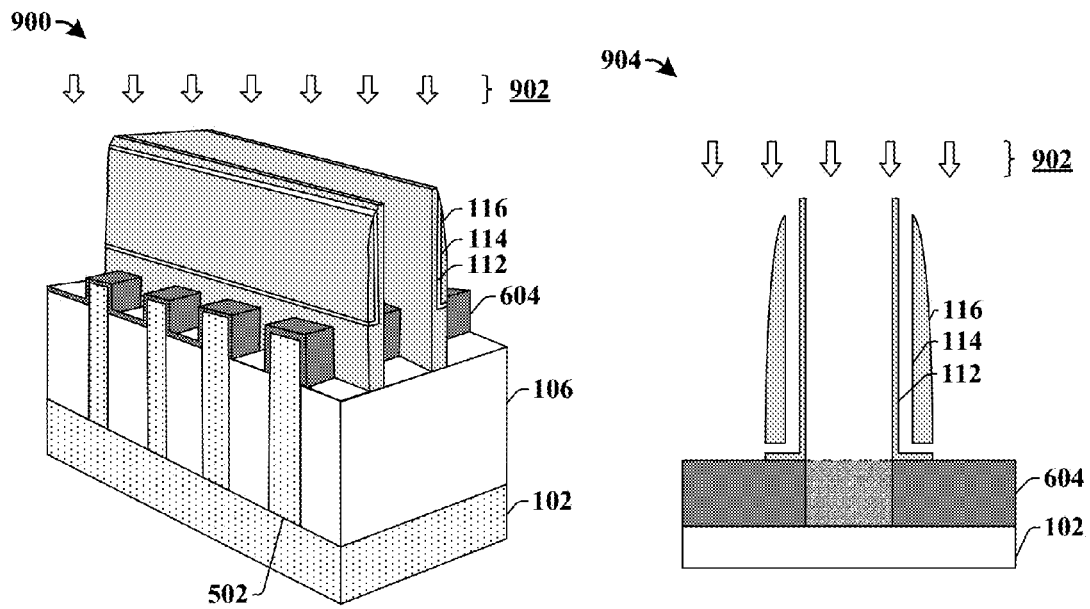

FIGS. 9A-9B illustrate some embodiments of a semiconductor substrate corresponding to act 416. FIG. 9A illustrates a three-dimensional view 900 of a semiconductor substrate corresponding to act 416. FIG. 9B illustrates a corresponding cross-sectional view 904 of the semiconductor substrate of FIG. 9A.

As shown in three-dimensional view 900, the substrate is exposed to an etchant 902. The etchant 902 is configured to simultaneously remove the sacrificial gate structure 702 and the sacrificial air gap layer 804. Removing the sacrificial air gap layer 804 results in sidewall spacers 110 having air gaps 114 disposed between the first layer of insulating material 112 and the second layer of insulating material 116. The air gaps 114 reduce the dielectric constant of the sidewall spacers 110.

The etchant 902 comprises a high etching selectivity that etches the sacrificial air gap layer 804 at a substantially higher rate (e.g., greater than 5×) than the first and second layers of insulating material, 112 and 114. As a result, the sacrificial air gap layer 804 may be etched away while the first and second layers of insulating material, 112 and 114, are left substantially intact. In some embodiments, the etchant 902 may comprise a wet etchant. In other embodiments, the etchant 902 may comprise a combination of a wet etchant and a dry etchant.

Figure 10:
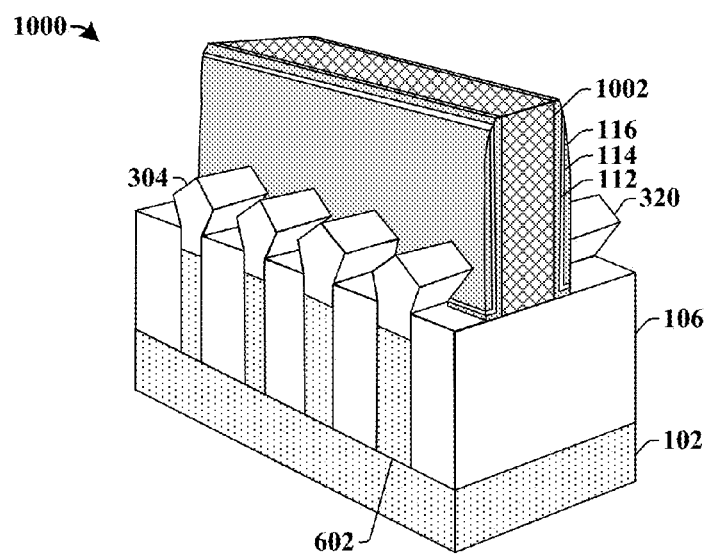

FIG. 10 illustrates a three-dimensional view 1000 of some embodiments of a semiconductor substrate corresponding to acts 418-420.

As shown in three-dimensional view 1000, a replacement gate structure 1002 is formed into a position of the removed sacrificial gate structure (e.g., 702). In some embodiments, the replacement gate structure 1002 may be formed by depositing a metal replacement gate onto the gate dielectric layer 604. In some embodiments, the metal replacement gate may comprise an aluminum formed using a deposition technique. In other embodiments, formation of the replacement gate structure 1002 may comprise depositing a replacement gate dielectric layer onto the one or more fins of semiconductor material 502 prior to the deposition of the metal replacement gate. In various embodiments, the replacement gate dielectric layer may comprise an inter-layer gate dielectric layer or a high-k gate dielectric layer.

As further shown in three-dimensional view 1000, the fins of semiconductor material 502 are selectively etched to form source and drain recesses. Formation of the recesses 808 may be performed using one or more etching processes comprising a dry etching process and/or a wet etching process (e.g., using a wet etchant comprising carbon tetrafluoride ($CF_4$), hydrogen flouride (HF), tetramethylammonium hydroxide (TMAH), etc). Source and drain regions, 304 and 320, are subsequently formed using an epitaxial growth process to deposit an epitaxial material. In various embodiments, the epitaxial material may comprise silicon, silicon-germanium (SiGe), silicon-carbide (SiC), etc. It will be appreciated that although the source and drain regions, 304 and 320, are illustrated as diamond-shaped, such shapes are not limiting and that in general the source and drain regions, 304 and 320, may have any profile shape.

Therefore, the present disclosure relates to a method of forming a FinFET (field effect transistor) device having sidewall spacers comprising an air gap that provides for a low dielectric constant, and an associated apparatus.

In some embodiments, the present disclosure relates to a method of forming a FinFET (Fin field effect transistor) device. The method comprises forming a fin of semiconductor material on a semiconductor substrate, and forming a gate structure protruding from the substrate at a position overlying the fin of semiconductor material, wherein the gate structure comprises a gate dielectric layer and an overlying gate material layer. The method further comprises forming a source region and a drain region on opposite ends of the gate structure at positions that electrically contact the fin of semiconductor material. The method further comprises forming sidewall spacers abutting opposing sides of the gate structure, wherein respective sidewall spacers comprise a first layer of insulating material abutting the gate structure and a second layer of insulating material separated from the first layer of insulating material by an air gap.

In other embodiments, the present disclosure relates to a method of forming a FinFET device. The method comprises forming one or more fins of semiconductor material on a semiconductor substrate between sections of isolating material, and forming a sacrificial gate structure protruding from the substrate at a position overlying the one or more fins of semiconductor material. The method further comprises forming a first layer of insulating material onto sidewalls of the sacrificial gate structure and over the one or more fins of semiconductor material, forming a sacrificial air gap layer onto sidewalls of the first layer of insulating material, and forming a second layer of insulating material onto sidewalls of the sacrificial air gap layer. The method further comprises simultaneously removing the sacrificial air gap layer and the sacrificial gate structure, wherein removing the sacrificial air gap layer forms air gaps disposed between the first layer of insulating material and the second layer of insulating material. The method further comprises forming a source region and a drain region on opposite ends of the gate structure at positions that electrically contact the one or more fins of semiconductor material.

In yet other embodiments, the present disclosure relates to a FinFET (Fin field effect transistor) device. The FinFET device comprises a three-dimensional fin of semiconductor material protruding from a substrate at a location between first and second sections of isolating material. The FinFET device further comprises a gate structure overlying the three-dimensional fin of semiconductor material and configured to control a flow of charge carriers within a channel region disposed within the three-dimensional fin of semiconductor material. The FinFET device further comprises sidewall spacers abutting opposing sides of the gate structure, wherein respective sidewall spacers comprise a first layer of insulating material abutting the gate structure and a second layer of insulating material separated from the first layer of insulating material by an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of forming a FinFET (Fin field effect transistor) device, comprising:
   forming a fin of semiconductor material on a semiconductor substrate;

forming a gate structure protruding from the substrate at a position overlying the fin of semiconductor material, wherein the gate structure comprises a gate dielectric layer and an overlying gate material layer;

forming a source region and a drain region on opposite ends of the gate structure at positions contacting the fin of semiconductor material;

forming a first layer of insulating material contacting opposite sides of the gate structure; and forming a second layer of insulating material that overlies the first layer of insulating material and that is separated laterally and vertically from the first layer of insulating material by an air gap.

2. The method of claim 1, further comprising:

forming the first layer of insulating material onto sidewalls of the gate structure and over the fin of semiconductor material;

forming a sacrificial air gap layer onto sidewalls and an upper surface of the first layer of insulating material;

forming the second layer of insulating material onto sidewalls and an upper surface of the sacrificial air gap layer; and removing the sacrificial air gap layer, so as to form the air gap between the first layer of insulating material and the second layer of insulating material.

3. The method of claim 2, wherein forming the gate structure comprises:

forming a sacrificial gate structure over the fin of semiconductor material;

removing the sacrificial gate structure after forming the first layer of insulating material and the second layer of insulating material;

depositing an inter-layer gate dielectric layer or a high-k gate dielectric layer into a position of the removed sacrificial gate structure; and depositing a metal replacement gate onto the inter-layer gate dielectric layer or the high-k gate dielectric layer.

4. The method of claim 3, wherein the sacrificial gate structure is removed simultaneously with the sacrificial air gap layer.

5. The method of claim 2, wherein the sacrificial air gap layer comprises polysilicon.

6. The method of claim 1, wherein the first layer of insulating material and the second layer of insulating material comprise silicon nitride.

7. The method of claim 1, wherein the air gap comprises an 'L' shaped air gap separated from the gate structure by the first layer of insulating material.

8. The method of claim 1, wherein the air gap comprises an 'L' shaped air gap that extends laterally from a first opening disposed at a first position vertically between the first insulating layer and the second insulating layer to a second opening disposed at a second position laterally between the first insulating layer and the second insulating layer.

9. A method of forming a FinFET device, comprising:

forming one or more fins of semiconductor material on a semiconductor substrate laterally between sections of isolating material;

forming a sacrificial gate structure protruding from the substrate at a position overlying the one or more fins of semiconductor material;

forming a source region and a drain region on opposite ends of the sacrificial gate structure at positions contacting the fin of semiconductor material;

forming a first layer of insulating material onto sidewalls of the sacrificial gate structure and over the one or more fins of semiconductor material;

forming a sacrificial air gap layer onto sidewalls of the first layer of insulating material, wherein the sacrificial air gap layer has a bottom surface that vertically contacts the first layer of insulating material along a first horizontal interface that is above the source region and the drain region;

forming a second layer of insulating material onto sidewalls of the sacrificial air gap layer, wherein the second layer of insulating material has a bottom surface that vertically contacts the sacrificial air gap layer along a second horizontal interface that overlies the source region and the drain region; and simultaneously removing the sacrificial air gap layer and the sacrificial gate structure, wherein removing the sacrificial air gap layer forms air gaps disposed between the first layer of insulating material and the second layer of insulating material.

10. The method of claim 9, further comprising:

depositing an inter-layer gate dielectric layer or a high-k gate dielectric layer into a position of the removed sacrificial gate structure; and depositing a metal replacement gate onto the inter-layer gate dielectric layer or the high-k gate dielectric layer.

11. The method of claim 10, wherein the air gaps comprise 'L' shaped air gaps separated from the gate structure by the first layer of insulating material.

12. The method of claim 9, wherein the sacrificial air gap layer is removed by an etching process using both a wet etchant and a dry etchant.

13. The method of claim 9, wherein the sacrificial air gap layer comprises polysilicon.

14. The method of claim 9, wherein the first layer of insulating material and the second layer of insulating material comprise silicon nitride.

15. A FinFET (Fin field effect transistor) device, comprising:

a three-dimensional fin of semiconductor material protruding from a substrate at a location between first and second sections of isolating material;

a gate structure overlying the three-dimensional fin of semiconductor material and configured to control a flow of charge carriers within a channel region disposed within the three-dimensional fin of semiconductor material;

a first layer of insulating material that contacts opposite sides of the gate structure; and a second layer of insulating material that overlies the first layer of insulating material and that is separated laterally and vertically from the first layer of insulating material by an air gap layer.

16. The FinFET device of claim 15, wherein the air gap comprises an 'L' shaped air gap that is separated from the gate structure by the first layer of insulating material and that extends laterally from a first opening disposed at a first position vertically between the first insulating layer and the second insulating layer to a second opening disposed at a second position laterally between the first insulating layer and the second insulating layer.

17. The FinFET device of claim 15, wherein the first layer of insulating material and the second layer of insulating material comprise silicon nitride.

18. The FinFET device of claim 15, wherein the air gap comprises an 'L' shaped air gap having a horizontal component and a vertical component, wherein the horizontal component protrudes outward from the vertical component at a right angle.

19. The method of claim 1, wherein the first layer of insulating material has a horizontal component and a vertical component, wherein the horizontal component protrudes outward from the vertical component at a location vertically underlying a top surface of the gate structure.

20. The Fin FET device of claim 15, wherein the first layer of insulating material has a horizontal component and a vertical component, wherein the horizontal component protrudes outward from the vertical component at a location vertically underlying a top surface of the gate structure.

* * * * *